US007236359B2

(12) United States Patent
Strobel

(10) Patent No.: US 7,236,359 B2
(45) Date of Patent: Jun. 26, 2007

(54) ENVIRONMENTAL CONTROL SYSTEM FOR PERSONAL COMPUTERS

(76) Inventor: Larry A. Strobel, P.O. Box 1842, Issaquah, WA (US) 98027

( * ) Notice: Subject to any disclaimer, the term of this patent is extended or adjusted under 35 U.S.C. 154(b) by 0 days.

(21) Appl. No.: 10/816,245

(22) Filed: Apr. 1, 2004

(65) Prior Publication Data
US 2005/0219812 A1 Oct. 6, 2005

(51) Int. Cl.
G06F 1/20 (2006.01)
H05K 7/20 (2006.01)
H05K 5/00 (2006.01)
A47B 97/00 (2006.01)
F25D 23/12 (2006.01)

(52) U.S. Cl. ............... 361/687; 361/691; 454/184; 312/223.2; 312/236; 62/259.2

(58) Field of Classification Search ........ 361/679–687, 361/724–727, 695, 826, 696; 32/259.2; 62/259.2; 165/80.3; 312/323.1, 236, 213, 223.2; 454/201, 454/184
See application file for complete search history.

(56) References Cited

U.S. PATENT DOCUMENTS

| 4,352,274 A | * | 10/1982 | Anderson et al. | 62/229 |
|---|---|---|---|---|
| 5,038,308 A | * | 8/1991 | Le et al. | 361/796 |
| 5,398,159 A | * | 3/1995 | Andersson et al. | 361/695 |
| 5,559,673 A | * | 9/1996 | Gagnon et al. | 361/695 |
| 5,706,668 A | * | 1/1998 | Hilpert | 62/259.2 |
| 5,813,243 A | * | 9/1998 | Johnson et al. | 62/259.2 |
| 5,851,143 A | * | 12/1998 | Hamid | 454/57 |
| 6,463,997 B1 | * | 10/2002 | Nicolai et al. | 165/80.2 |
| 6,483,709 B1 | * | 11/2002 | Layton | 361/724 |
| 6,589,308 B1 | * | 7/2003 | Gianelo | 55/385.6 |
| 6,628,520 B2 | * | 9/2003 | Patel et al. | 361/696 |
| 6,896,612 B1 | * | 5/2005 | Novotny | 454/184 |
| 2004/0007348 A1 | * | 1/2004 | Stoller | 165/47 |
| 2005/0185377 A1 | * | 8/2005 | Gravina | 361/687 |

* cited by examiner

Primary Examiner—Lisa Lea-Edmonds
Assistant Examiner—Zachary Pape
(74) Attorney, Agent, or Firm—Seed IP Law Group PLLC

(57) ABSTRACT

An environmental control unit for a personal computer tower case includes an enclosure configured to substantially enclose the tower case and an air conditioning unit configured to draw air from a first region of the enclosure, cool the air to within a selected range of temperatures, and output the air into a second region of the enclosure. The enclosure includes a gasket disposed between an outer wall of the tower case and an inner surface of the enclosure, for preventing circulation of air within the enclosure and around an exterior of the case. The enclosure may also include a port for access to a front side of the personal computer case, and an aperture in a back wall of the enclosure for passage of cables. The aperture is configured to permit passage of the cables while limiting passage of air.

21 Claims, 5 Drawing Sheets

ENVIRONMENTAL CONTROL SYSTEM FOR PERSONAL COMPUTERS

BACKGROUND OF THE INVENTION

1. Field of the Invention

The present application is directed generally to environmental control for personal computers, and in particular to removal of waste heat from personal computer systems.

2. Description of the Related Art

In recent years, computer technology has continued to advance at an ever greater pace. In particular, improvements in microchip manufacturing technology have led to the development of ever more powerful processors and memory chips having greater capacity than previously available. These improvements are due in large part to the reduction in size of individual circuits on the microchips. These advances, in turn, have led to systems, such as personal computers, having vastly greater speed, power, and data handling capabilities than previously available.

One consequence of this trend toward more compact, faster, and more powerful systems, is that heat production, as a waste byproduct, is concentrated into smaller areas. Inasmuch as excessive heat may affect the performance of a computer system, or even cause damage, various means are employed for control and removal of heat generated by components of computer systems. For example, most modern computer systems include a fan located in the power supply of a computer system, which in turn is located, generally, in an upper back portion of a typical computer tower cabinet. The cabinet is generally provided with louvers or intake vents in a lower front portion, and the fan is configured to blow air outward from the upper rear portion. Accordingly, exterior air is drawn in through the lower front region of the case, through the interior of the case to the upper rear portion, where it is blown outward. Additionally, individual components of a computer system that are especially high in production of heat, such as the CPU, may be provided with heat-sinks or fans.

BRIEF SUMMARY OF THE INVENTION

According to an embodiment of the invention, an environmental control unit for a personal computer is provided, including an enclosure configured to substantially enclose the personal computer, and an air conditioning unit configured to draw air from a first region of the enclosure, cool the air to within a selected range of temperatures, and output the air into a second region of the enclosure. The enclosure may include an air block or baffle, such as a gasket, for preventing circulation of air around an exterior of a case of the personal computer and forcing it to go through the computer case. The enclosure may also include a port for access to a front side of the personal computer case, and an aperture in a wall of the enclosure for passage of cables. The aperture is configured to permit passage of the cables while limiting passage of air.

According to another embodiment of the embodiment, a system is provided, including a cabinet having a closure configured to be substantially airtight when closed, a personal computer positioned within the cabinet, and a cooling unit positioned within the cabinet, the cooling unit configured to draw air from a first region of the cabinet, cool the air to within a selected range of temperatures, and output the air into a second region of the cabinet. The system may further include a disk drive positioned within the computer, with the cabinet having an access panel for access to the disk drive. The system may also include a video monitor coupled to the computer via a cable, the cabinet receiving the cable via an aperture provided therefore.

An embodiment of the Invention provides a method for cooling a personal computer, including drawing air into a cooling unit coupled to an enclosure, cooling the air, blowing the air from the cooling unit to a first region within the enclosure, drawing the air from the first region into a personal computer case positioned within the enclosure, transferring heat from components within the personal computer case to the air, and blowing the air from the case to a second region within the enclosure.

Embodiments of the invention provide the advantages of environmental control for individual computers without the need for dedicated rooms or expensive and complex HVAC systems.

BRIEF DESCRIPTION OF THE SEVERAL VIEWS OF THE DRAWING(S)

DETAILED DESCRIPTION OF THE INVENTION

Figure 1:
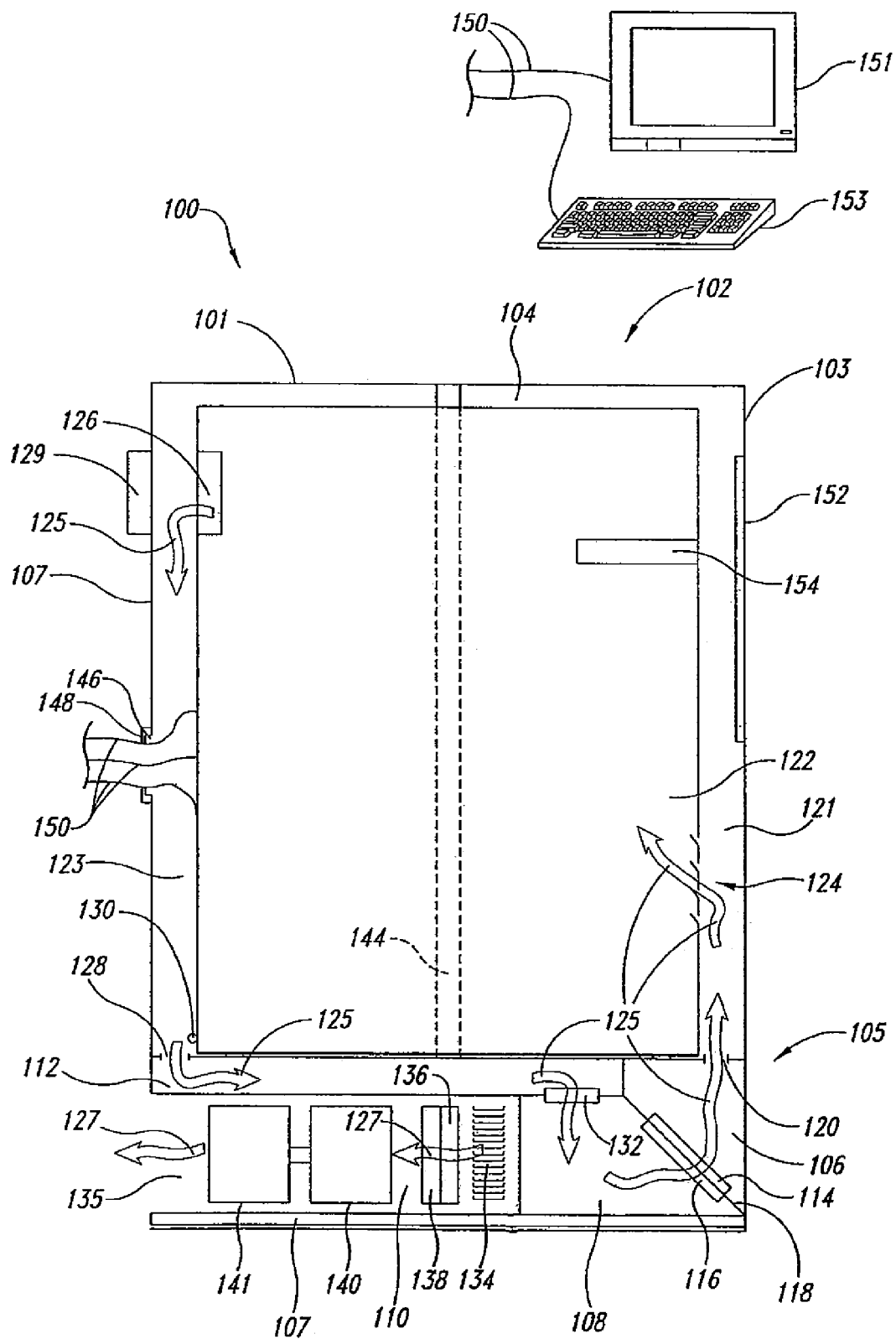
FIG. 1 shows, diagrammatically, a first embodiment of the invention, including a cooling unit coupled to an enclosure for a personal computer.

A first embodiment of the invention is described with reference to FIG. 1, which shows a computer cooling system 100. The system 100 includes an enclosure 102 sized and shaped to receive a typical computer tower case 122 in a main chamber thereof 104. The enclosure 102 is substantially airtight and has a front wall 103, top wall 101, and back wall 107. The enclosure further includes a panel or door 152 positioned to provide access to the disk drive bays 154 commonly found on the front side of the case 122. The panel 152 may be coupled to the enclosure 102 via hinges, clips, friction latches, magnetic catches, or other appropriate devices. The enclosure 102 includes an aperture 146 disposed in the rear of the enclosure 102. The aperture 146 is positioned and configured to provide passage for power and connection cables 150 from the interior of the enclosure 102 to peripheral devices such as video monitor 151 and keyboard 153, for example.

While not shown in FIG. 1, the system 100 may also include access doors or panels in other portions of the enclosure 102, for access to other portions of the case 122. For example, a door may be positioned to provide access to a back portion of the case 122.

The system 100 is shown in diagrammatical form, and so does not show thickness with respect to the walls of the enclosure 102, but depicts the interior as though a side of the enclosure were removed. The enclosure 102 may be manufactured from any suitable material, such as wood, plastic or metal. Additionally, the enclosure may be insulated to provide improved temperature control therein.

The main chamber 104 of the enclosure 102 includes a gasket 144 positioned within the enclosure 102, The gasket 144 is configured to seal a gap between an outside surface of the tower case 122 and an inside surface of the enclosure 102 for the purpose of preventing air from passing around the tower case 122, from a front region 121 of the main chamber 104 to a back region 123 thereof. The gasket 14 is formed from any suitable material capable of conforming to the exterior of the computer case to create a seal, such as an elastomeric material.

The system 100 also includes a cooling unit 105 located, in the embodiment of FIG. 1, in a lower portion of the enclosure 102. The cooling unit 105 includes an intake vent 128, an air return duct 112, a warm air, or recycled air, chamber 108, a conditioned air plenum 106, and an output vent 120. A divider 118 divides the warm air chamber 108 from the conditioned air plenum 106. An evaporator coil 116 and evaporator fan 114 are positioned over an opening in the divider 118. A filter 132 is provided in the cooling unit, and configured to remove contaminants from the air as it is drawn into the unit. A thermostat 130 is located near the intake vent 128.

A condenser fan 136 and condenser coil 138 are positioned in a service chamber 110, together with a motor and a compressor 140. Heat exchange intake vents 134 are provided on the sides of the enclosure, and an exhaust vent 135 is located in the rear. According to one embodiment of the invention, many of the components of the cooling unit 105 are coupled to a removable drawer platform 107, such that they may be withdrawn from a rear portion of the enclosure 102 as a complete unit for service or replacement. The platform 107 may be positioned on rollers for ease of removal.

Inasmuch as the refrigeration technology of the type discussed herein is well known, some details of the cooling unit are not shown in FIG. 1. For example, the coolant lines that extend between the evaporator coil 116 and the condenser coil 138, power lines for the evaporator fan 114, the condenser fan 136, and the compressor motor 141 are present but not shown, since such structures are connections are well known in the art. The configuration and location of the cooling unit may vary, and other types of cooling systems may be employed, such as thermoelectric, for example. Such variations fall within the scope of the invention.

According to the embodiment of FIG. 1, the system 100 is a closed-loop cooling system, configured to filter and recycle air continuously through the system.

Figure 2:
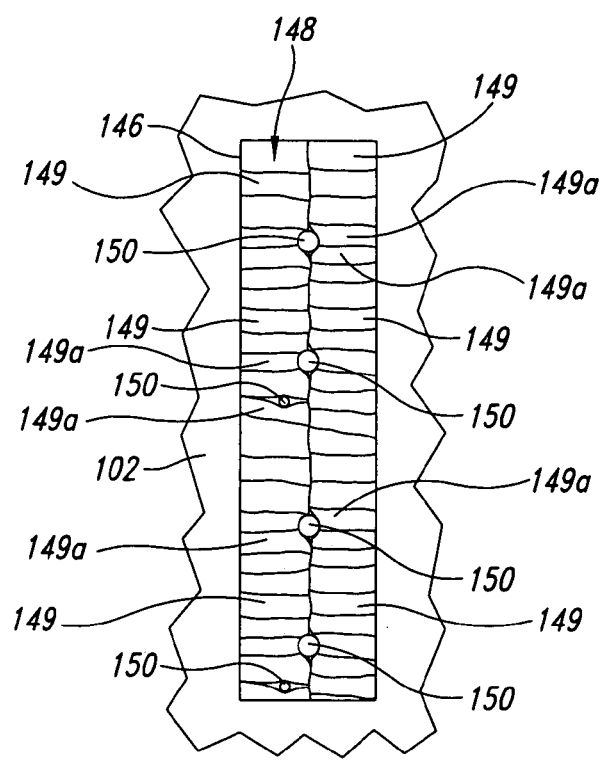
FIG. 2 illustrates a detail of a back surface of the enclosure of FIG. 1.

As illustrated in FIG. 2, the aperture 146 is provided with sealing means 148 for minimizing passage of air through the aperture 146. FIG. 2 shows a detail of a portion of the back wall 107 of the enclosure 102, including the aperture 146, which is provided for passage of power and data cables 150. The aperture 146 includes sealing means 148 for restricting flow of air therethrough. The sealing means 148 may comprise, as shown in FIG. 2, elastomeric members 149 extending from either side of the aperture 146, and positioned contiguous to each other. The members 149a that are in contact with cables 150 accommodate the cables and provide passage thereto, while the remaining members 149, make firm contact with those members 149 from the opposite side of the aperture 146, effectively closing the aperture 146. Accordingly, only small openings remain, which are insignificant with respect to the conditioning of the air in the enclosure 102.

The members 149 may be formed of any resilient material capable of functioning as described, such as, for example, natural or synthetic foam rubber.

Sealing means 148 may also comprise other types of closures. For example, instead of a plurality of small elastomeric members 149, one or two large elastomeric members may be employed. In another embodiment, brush-like bristles are provided on either side of the aperture 146, which function in a manner similar to that of the members 149. Other means for closing the aperture 146 are also considered to fall within the scope of the invention.

Aperture 146 is shown in shown in FIG. 2 in a vertical orientation. The aperture 146 may also be configured horizontally, or have another shape selected to provide adequate passage for cables.

Figure 3:
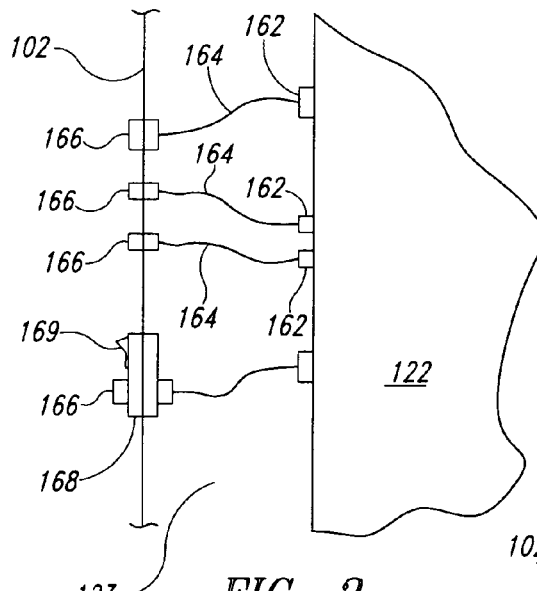
FIG. 3 illustrates a detail of an alternative embodiment of the invention.

According to another embodiment, as illustrated in FIG. 3, Jump cables 164 and jump ports 166 are provided in the back region 123 of the enclosure 102. The jump cables are configured, at first ends thereof, each to engage a service port 62 of the computer, 122. Typical service ports include USB ports, serial and parallel ports, keyboard and video monitor ports, etc. Each of the jump cables is configured to engage one side of a jump port 166, located on an inner surface of the enclosure 102. The jump ports extend through the wall of the enclosure 102 and provide a receptacle 167 on the outside of the enclosure, configured to receive a connector corresponding to the respective service port 162. In this manner, the integrity of the enclosure 102 is improved, and connection to the computer is made more convenient.

The enclosure 102 may also include a surge protector 168 configured to protect the computer 122 from power surges the surge protector 168 is also provided with a jump cable 164 to couple the surge protector 168 to the power supply of the computer (not shown), while providing a receptacle 167 configured to receive a power cable. The surge protector further 168 includes a power switch 169.

Figure 4:
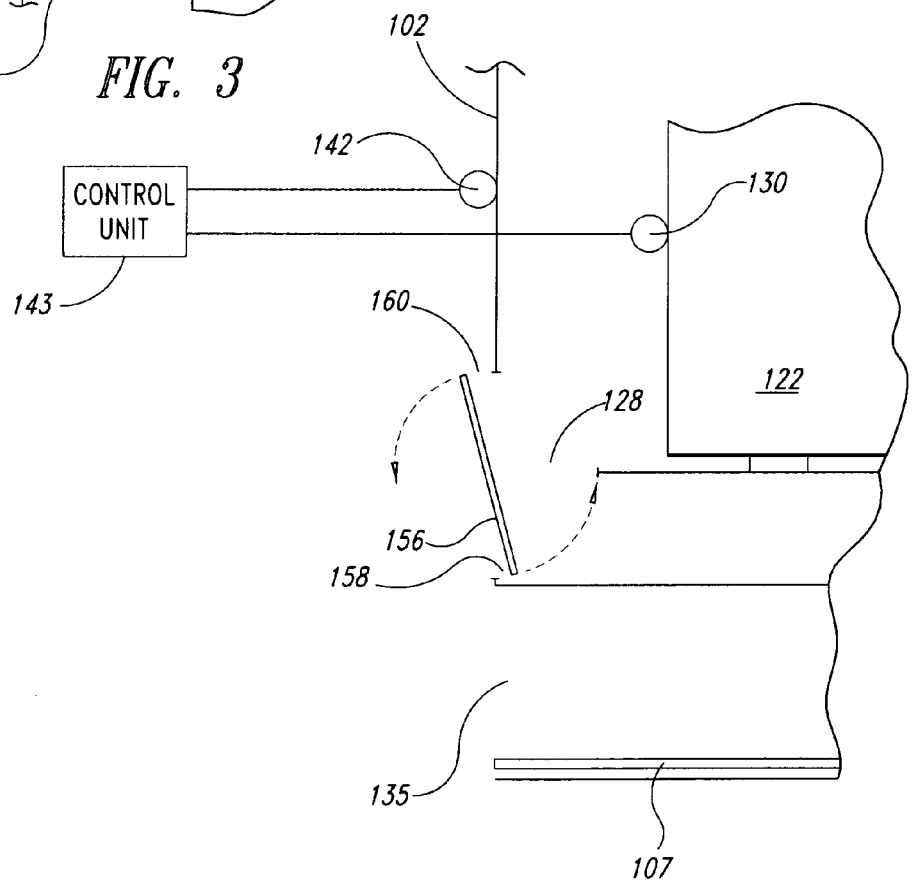
FIG. 4 illustrates a detail of another alternative embodiment of the invention.

FIG. 4 shows one example of an alternative embodiment. An air control door 156 is provided, configured to open or close the intake vent 128 while closing or opening an exterior intake vent 158 and an exterior exhaust vent 160. When the air control door 156 is in a first position, as shown in FIG. 4, the intake vent 128 is open, while the exterior intake vent 158 and exterior exhaust vent 160 are closed. When the air control door 156 is in a second position, as shown by the dotted arrows in FIG. 4, the intake vent 128 is closed, while the exterior intake vent 158 and exterior exhaust vent 160 are open.

It will be understood that the components shown may be positioned in locations or configurations other than those depicted. For example, the air exchange port 156 is shown as a single unit, positioned directly above the exhaust vent 135. It will be recognized that this may not be the most desirable location, inasmuch as it would be undesirable to draw air warmed by the condenser coils 138 back into the return duct 112 to be recooled. Accordingly, the air exchange port 156 may actually comprise separate valves or doors for closing the intake vent 128, opening the exterior exhaust vent 160 and opening the exterior intake vent 156, and that the intake vent 156 may be located some distance from the exhaust vents 160 and 135.

In operation, according to the embodiments of FIGS. 1–3, the evaporator fan 114 draws air, indicated by arrows 125, from the warm air chamber 108 through the evaporator 116, where the air is cooled by the evaporation process of the coolant within the evaporator coils 116. The conditioned air in the conditioned air plenum 106 is forced by fan 114 through the output vent 120 into the main chamber 104. Due to the presence of the gasket 144, the conditioned air does not travel around the outside of the case 122. The conditioned air is drawn by the suction of the computer exhaust fan 126, and by the overpressure of the air in the plenum 106 into the air intake louvers 124 of the tower case 122. The cooled air circulates inside the case 122, cooling the components therein, until it is blown into the back region 123 of the enclosure 102 by the exhaust fan 126. The air is drawn from the back region 123 of the enclosure 102 through the intake vent 128 to the return duct 112, whence it passes again into the warm air chamber 108, to be recooled and recirculated.

Evaporated coolant in the evaporator 116 is drawn by the compressor 140 from the evaporator 116 and pumped into the condenser 138. The condenser fan 136 draws air, indicated by arrows 127, from the exterior of the enclosure 102 through the heat exchange intake vents 134, and blows the air through the condenser coils 138 to cool the coils. The air continues past the compressor 140 and the motor 141 and exits the exhaust vent 135.

The thermostat 130 is configured to sense air temperature in the back region 123 of the enclosure 102 and to control the operation of the cooling unit 105, such that the air temperature in the back region 123 remains within a selected range of temperatures. When the temperature of the air in the back region 123 of the enclosure 102 is within a selected range, the thermostat 130 is configured to turn off the compressor 140, such that coolant ceases to circulate within the system. However, the fan 114 continues to operate, such that air continues to circulate within the enclosure 102. The system 100 may be configured to shut off the fan 114 if the air temperature in the back region 123 of the enclosure drops below a second, lower threshold. Alternatively, the cooling unit 105 may be coupled to the power supply of the computer within the case 122, such that, when the computer is turned off, the cooling unit 105 also shuts down.

According to another embodiment of the invention, as illustrated in FIG. 4, a second thermostat 142 is provided, together with the air exchange mechanism 156. When air temperature within the back region 123 of the enclosure 102, as indicated by the thermostat 130, rises above the temperature of the air outside the enclosure 102, as indicated by thermostat 142, the air exchange mechanism 156 is activated by a control circuit 143 (shown diagrammatically), which causes air from the back region 123 to vent to the outside of the enclosure 102, while cooler air from the outside is drawn into the return duct 112 to be cooled, such that the coolest air available is drawn in, thus maximizing the economy of the system. Filter 132 serves to remove dust from the air, that would otherwise tend to foul the evaporator coils 116 and the components within the computer case 122.

Figure 5:
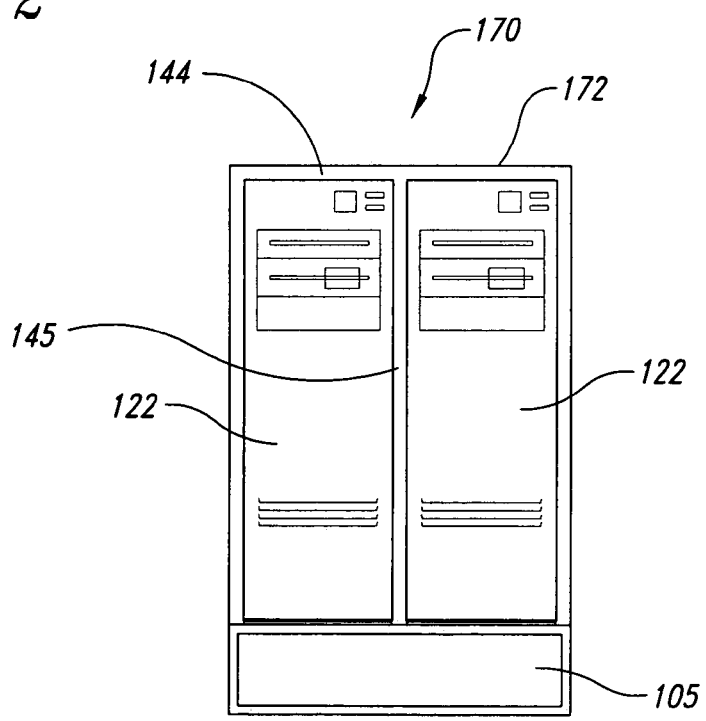
FIG. 5 illustrates another embodiment of the invention, configured to receive a plurality of tower cases.
Figure 6:
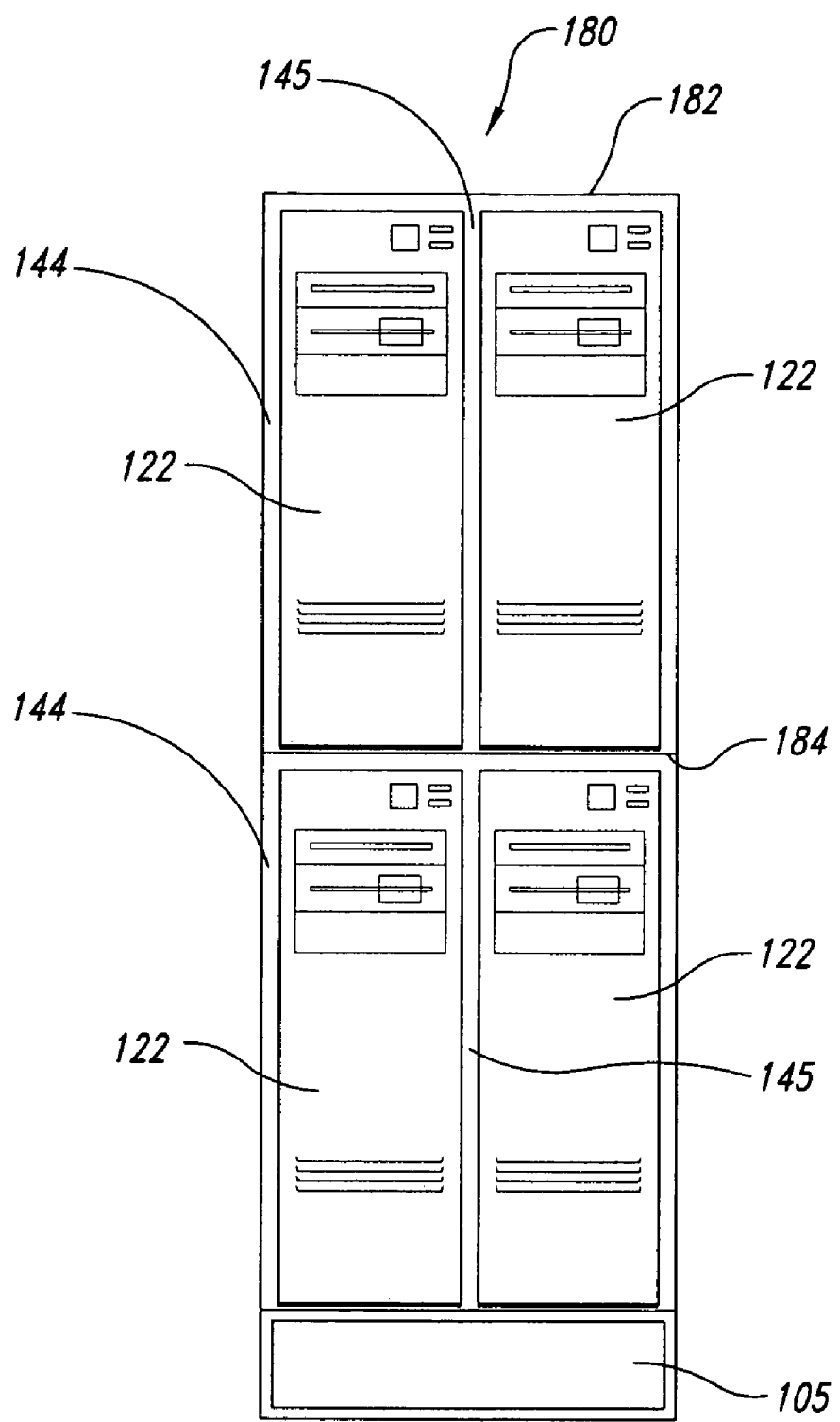
FIG. 6 shows another embodiment of the invention configured to receive a plurality of tower cases.

While the embodiment of FIGS. 1–4 have been described with reference to a single computer tower case 122, FIGS. 5 and 6 illustrate alternative embodiments of the invention. FIG. 5 illustrates a system 170, comprising an enclosure 172 configured to receive two computer tower cases 122. In the embodiment of FIG. 5, as well as that of FIG. 6, described below, a gasket 145 is provided between the individual tower cases 122, in addition to the gasket 144, which extends between the interior surface of the enclosure 172 and the cases 122. The gasket 145 prevents conditioned air from passing between the cases 122 without passing through the cases 122.

FIG. 6 illustrates a system 180, including an enclosure 182 configured to receive a plurality of computer tower cases 122, including two layers, with an upper layer of tower cases 122 resting on a shelf 184.

It will be recognized that, in the cases of the embodiments of FIGS. 5 and 6, the cooling units 105 are configured to have sufficient cooling capacity to accommodate the number of computer systems positioned therein.

The term "tower case" is used here in a generic fashion, to indicate any of the various sizes and shapes of cases commonly used to house personal computers. The enclosures described with reference to the various embodiments of the invention may be configured to accommodate other sizes and shapes of computer cases without deviating from the scope of the invention.

In previously known systems, if the fans and other cooling mechanisms provided within a personal computer case are inadequate to control the heat generated therein, a typical response is to place more fans and heat sinks in and around the system components. Or, in the case of some commercial computer systems, such as network routers and servers, the systems are located in an environment where the temperature around the system can be controlled. For practical purposes what this means is that a room is provided with a dedicated cooling plant to maintain the environment around the computers at an appropriate temperature. Such rooms are extremely expensive to build and operate, and they also generally occupy much more space than is actually necessary.

In contrast, according to the various embodiments of the invention, an enclosure is provided for maintaining only as much space as is needed for a given application. Additionally, because the systems illustrated are portable, significant savings may be realized when a computer is moved from one location to another.

Figure 7:
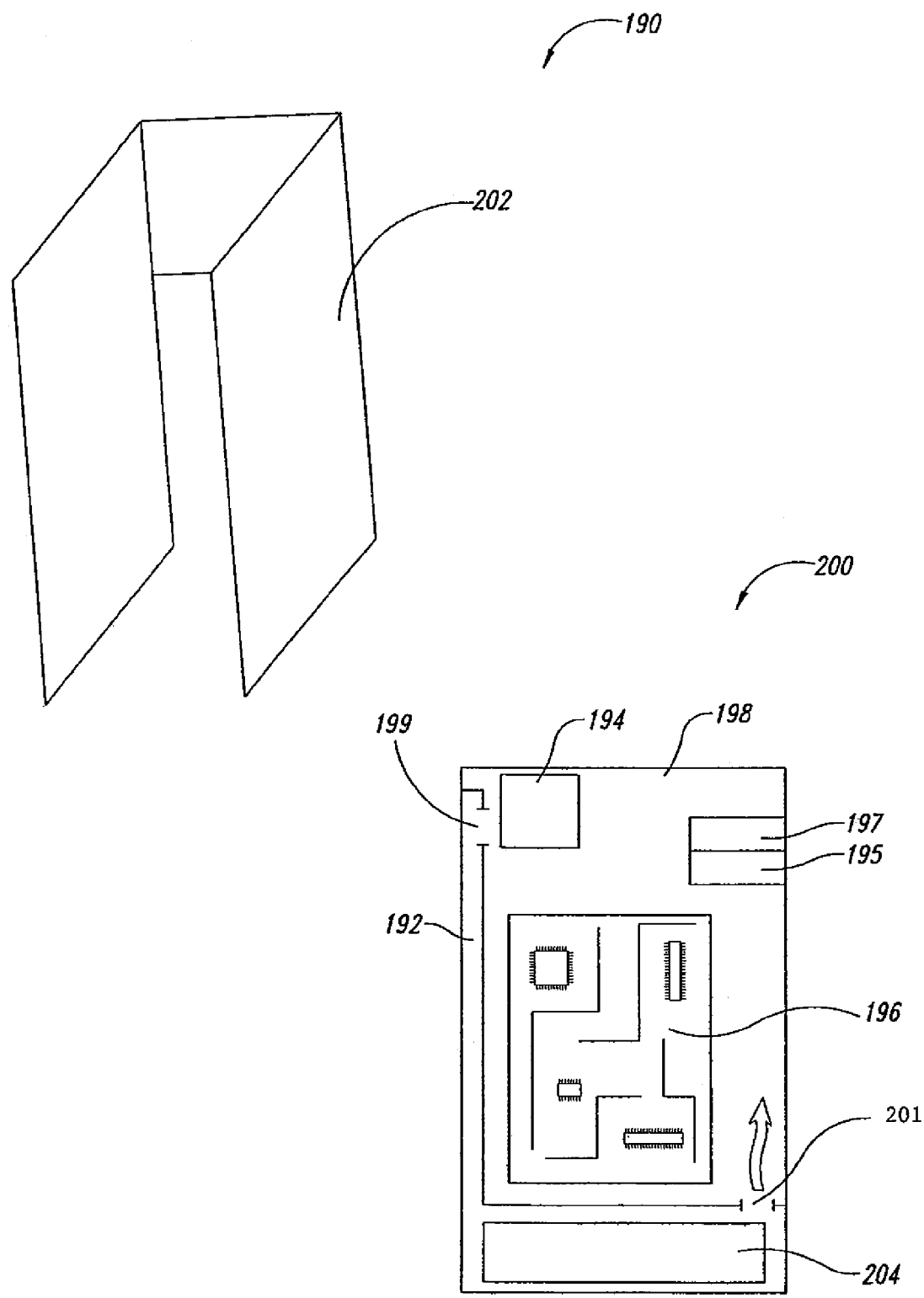
FIG. 7 illustrates an additional embodiment of the invention.

According to the embodiment illustrated in FIG. 7, a system 190 includes a cooling unit 105 incorporated into a computer case 200 itself. The system includes a chassis 198, to which may be coupled standard and optional components, including, for example, a power supply 194, a mother board, hard drive 195, and disk drives 197. The case includes a return duct 192 with an intake vent 199 located in an upper region of the case. A cover 202 is provided, configured to provide a substantially air tight seal when closed on to the chassis 198.

Air is drawn into the cooling unit 204 via the intake vent 199 and return duct 192. The cooling unit 204, shown as a simple block in FIG. 7, is configured to receive air from the return duct 192, cool the air to within a selected range of temperatures, and return the cooled air to the case 200 via the output vent 201. The cooling unit 204 may be similar to the cooling unit 105 described with reference to FIG. 1, or may be some other device configured to cool air. The air is conditioned by the cooling unit 204, then blown into the lower front region of the case 200 via the output vent 201.

The return duct 192 and intake vent 199 may be positioned and configured to receive air directly from the power supply fan (not shown), common to most power supplies, then return the air to the cooling unit 105, while the evaporator fan 114 (see FIG. 1) completes the circuit by moving the air through the evaporator coil 116 and into the case 200, via the output vent 201.

Alternatively, the evaporator fan 114 of the cooling unit 105 may be configured to be sufficiently powerful to draw air through the power supply, via the intake vent 199 and return duct 201, then force the air through the evaporator coil 116 and back into the main portion of the case 200 via the output vent 201.

An embodiment of the invention may provide a back-up system 129 (shown diagrammatically in FIG. 1) configured to respond to a failure of the cooling unit. Such a back-up system may include combinations of ventilation panels, louvers, or fans configured to activate in the event of a loss of power, or function to the cooling unit, or in response to excessive temperature within the enclosure.

The embodiment of FIG. 7 eliminates the need for a separate enclosure to provide conditioned air for a computer system, and may be more compact. However, the embodiments of FIGS. 1-6 provide additional flexibility, inasmuch as they may be configured to accommodate a wide variety of systems.

It will be recognized that not every feature of a given embodiment is essential, and features of the various embodiments described may be intermixed in additional embodiments, all of which also fall within the scope of the invention.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A computer system comprising:
a cabinet having a closure configured to be substantially airtight when closed;
a personal computer, including a power supply, positioned within the cabinet;
a gasket positioned in a space between an inner surface of the cabinet and an outer surface of the personal computer and configured to prevent passage of air, through a space between the personal computer and the inner surface of the cabinet, between a first region and a second region; and
a cooling unit positioned within the cabinet, the cooling unit configured to draw air from the first region, cool the air and output the air into the second region.

2. The computer system of claim 1, further comprising:
a disk drive positioned within the computer, the cabinet including an access panel for access to the disk drive.

3. The computer system of claim 1, further comprising:
a video monitor coupled to the computer via a cable; and
an opening in the cabinet for receiving the cable.

4. The computer system of claim 1, further comprising:
a jump cable coupled at a first end to a port of the computer, and coupled at a second end to a port in a wall of the cabinet.

5. An environmental control unit for a personal computer comprising:
an enclosure configured to substantially enclose the computer, separately encased in a tower case;
means for preventing circulation of air within the enclosure and around an exterior of a case of the personal computer between a first region of the enclosure and a second region of the enclosure; and
an air conditioning unit configured to draw air into the unit, cool the air to within a selected range of temperatures, and blow the air into the enclosure.

6. The control unit of claim 5 wherein the air conditioning unit is configured to draw air from the first region of the enclosure and blow the air into the second region of the enclosure.

7. The unit of claim 5 wherein the preventing means comprises:
a gasket configured to substantially seal a space between an interior surface of the enclosure and the exterior of the personal computer case, on three sides of the case.

8. The unit of claim 5 wherein the air conditioning unit is configured to selectively draw air from the first region of the enclosure, or draw air from a region of the exterior of the enclosure while air from the first region of the enclosure is vented to the exterior, and wherein the unit is farther configured to blow the air into the second region of the enclosure.

9. The unit of claim 8, further comprising:
means for comparing the temperature of air in the first region of the enclosure with the temperature of air outside the enclosure; and
a control circuit coupled to the comparing means to control the region from which the air is selected.

10. The unit of claim 5, farther comprising a port for access to a front side of the personal computer case.

11. The unit of claim 5, further comprising:
an aperture in a wall of the enclosure for passage of cables.

12. The unit of claim 5, further comprising:
a cable port located in a wall of the enclosure and configured to receive a jump cable for coupling the cable port to a service port of the computer, the cable port comprising a jump port configured to receive a service connection.

13. The unit of claim 5, further comprising:
a filter configured to remove contaminants from air drawn into the air conditioning unit.

14. The unit of claim 5, further comprising:
a thermostat configured to control operation of the air conditioning unit according to a level of the temperature of the air in the enclosure.

15. The unit of claim 5 wherein the enclosure is configured to substantially enclose a plurality of personal computers.

16. The unit of claim 5, further comprising:
a back-up ventilation system configured to operate in response to a failure of the air conditioning unit.

17. The unit of claim 5 wherein the preventing means comprises:
a gasket configured to substantially seal a space between an interior surface of the enclosure and the exterior of the personal computer case, on at least one side of the case.

18. A method of cooling a personal computer positioned within an enclosure, comprising:
drawing air into a cooling unit coupled to the enclosure;
cooling the air;
blowing the air from the cooling unit to a first region within the enclosure, while preventing the air from circulating to a second region within the enclosure without passing through the personal computer;
moving the air from the first region into a case of the personal computer positioned within the enclosure;
transferring heat from components, including a power supply, within the personal computer case to the air; and
moving the air from the personal computer case to a second region within the enclosure.

19. The method of claim 18 wherein the drawing air into the cooling unit step comprises:

drawing air from the second region into the cooling unit.

20. The method of claim 18, further comprising:

exhausting the air outside the enclosure, and the drawing air into the cooling unit step comprises drawing air from outside the enclosure, into the cooling unit.

21. The method according to claim 18 wherein the step of moving the air includes:

Blowing the air with a fan at an exhaust location in the personal computer case to remove air from the personal computer.

* * * * *

UNITED STATES PATENT AND TRADEMARK OFFICE
CERTIFICATE OF CORRECTION

| | |
|---|---|
| PATENT NO. | : 7,236,359 B2 |
| APPLICATION NO. | : 10/816245 |
| DATED | : June 26, 2007 |
| INVENTOR(S) | : Larry A. Strobel |

It is certified that error appears in the above-identified patent and that said Letters Patent is hereby corrected as shown below:

<u>Column 8</u>

Line 14, "farther" should read as -- further --

Signed and Sealed this

Third Day of June, 2008

JON W. DUDAS
*Director of the United States Patent and Trademark Office*